US009189313B2

(12) United States Patent
Matsuyama et al.

(10) Patent No.: US 9,189,313 B2
(45) Date of Patent: Nov. 17, 2015

(54) MEMORY SYSTEM HAVING NAND-TYPE FLASH MEMORY AND MEMORY CONTROLLER WITH SHIFT READ CONTROLLER AND THRESHOLD VOLTAGE COMPARISON MODULE

(71) Applicant: Kabushiki Kaisha Toshiba, Tokyo (JP)

(72) Inventors: Motohiro Matsuyama, Hino (JP); Yoko Masuo, Iruma (JP); Gen Ohshima, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 262 days.

(21) Appl. No.: 13/780,276

(22) Filed: Feb. 28, 2013

(65) Prior Publication Data

US 2014/0059396 A1  Feb. 27, 2014

Related U.S. Application Data

(60) Provisional application No. 61/693,442, filed on Aug. 27, 2012.

(51) Int. Cl.
| G06F 11/07 | (2006.01) |
| G06F 11/10 | (2006.01) |
| G06F 12/00 | (2006.01) |
| G11C 11/56 | (2006.01) |
| G11C 16/34 | (2006.01) |

(52) U.S. Cl.
CPC ........ *G06F 11/0751* (2013.01); *G06F 11/1028* (2013.01); *G06F 12/00* (2013.01); *G11C 11/5628* (2013.01); *G11C 11/5642* (2013.01); *G11C 16/3422* (2013.01); *G06F 11/1024* (2013.01)

(58) Field of Classification Search
CPC ............ G06F 11/1028; G06F 11/1068; G06F 11/1072; G06F 11/1024; G11C 16/349; G11C 16/3459; G11C 16/3463; G11C 16/3454; G11C 16/3418; G11C 16/3422; G11C 16/3431
See application file for complete search history.

(56) References Cited

U.S. PATENT DOCUMENTS

| 4,891,811 A * | 1/1990 | Ash et al. ...................... 714/719 |
| 5,721,739 A * | 2/1998 | Lyle .............................. 714/755 |
| 5,793,943 A * | 8/1998 | Noll ............................... 714/6.1 |
| 2002/0105832 A1 | 8/2002 | Kawakami |
| 2005/0013165 A1* | 1/2005 | Ban ............................. 365/185.2 |

(Continued)

FOREIGN PATENT DOCUMENTS

| JP | 2002-230984 | 8/2002 |
| JP | 2007-128577 | 5/2007 |
| JP | 2007-157239 | 6/2007 |

(Continued)

*Primary Examiner* — Joseph Schell
(74) *Attorney, Agent, or Firm* — Oblon, McClelland, Maier & Neustadt, L.L.P.

(57) ABSTRACT

According to one embodiment, a memory system includes a NAND-type flash memory and a memory controller. A comparison module of the memory controller compares a first threshold voltage distribution of a first memory area with a second threshold voltage distribution of the first memory area acquired earlier than the first threshold voltage distribution, if an error is detected in data read from the first memory area. An error factor determination module of the memory controller determines a cause of the error based on the comparison result, and inhibits a data move operation of moving data of the first memory area to the second memory area based on the determination result.

18 Claims, 6 Drawing Sheets

(56) References Cited

U.S. PATENT DOCUMENTS

| | | |
|---|---|---|
| 2007/0130496 A1 | 6/2007 | Kanno |
| 2007/0174740 A1 | 7/2007 | Kanno |
| 2008/0162854 A1* | 7/2008 | Hashimoto et al. ........... 711/167 |
| 2008/0175063 A1 | 7/2008 | Son et al. |
| 2009/0210772 A1* | 8/2009 | Noguchi ....................... 714/764 |
| 2010/0235715 A1* | 9/2010 | Thatcher et al. .............. 714/763 |
| 2012/0060066 A1 | 3/2012 | Nagadomi et al. |
| 2012/0268994 A1 | 10/2012 | Nagashima |

FOREIGN PATENT DOCUMENTS

| | | |
|---|---|---|
| JP | 2008-181628 | 8/2008 |
| JP | 2009-87509 | 4/2009 |
| JP | 2011-100519 | 5/2011 |

* cited by examiner

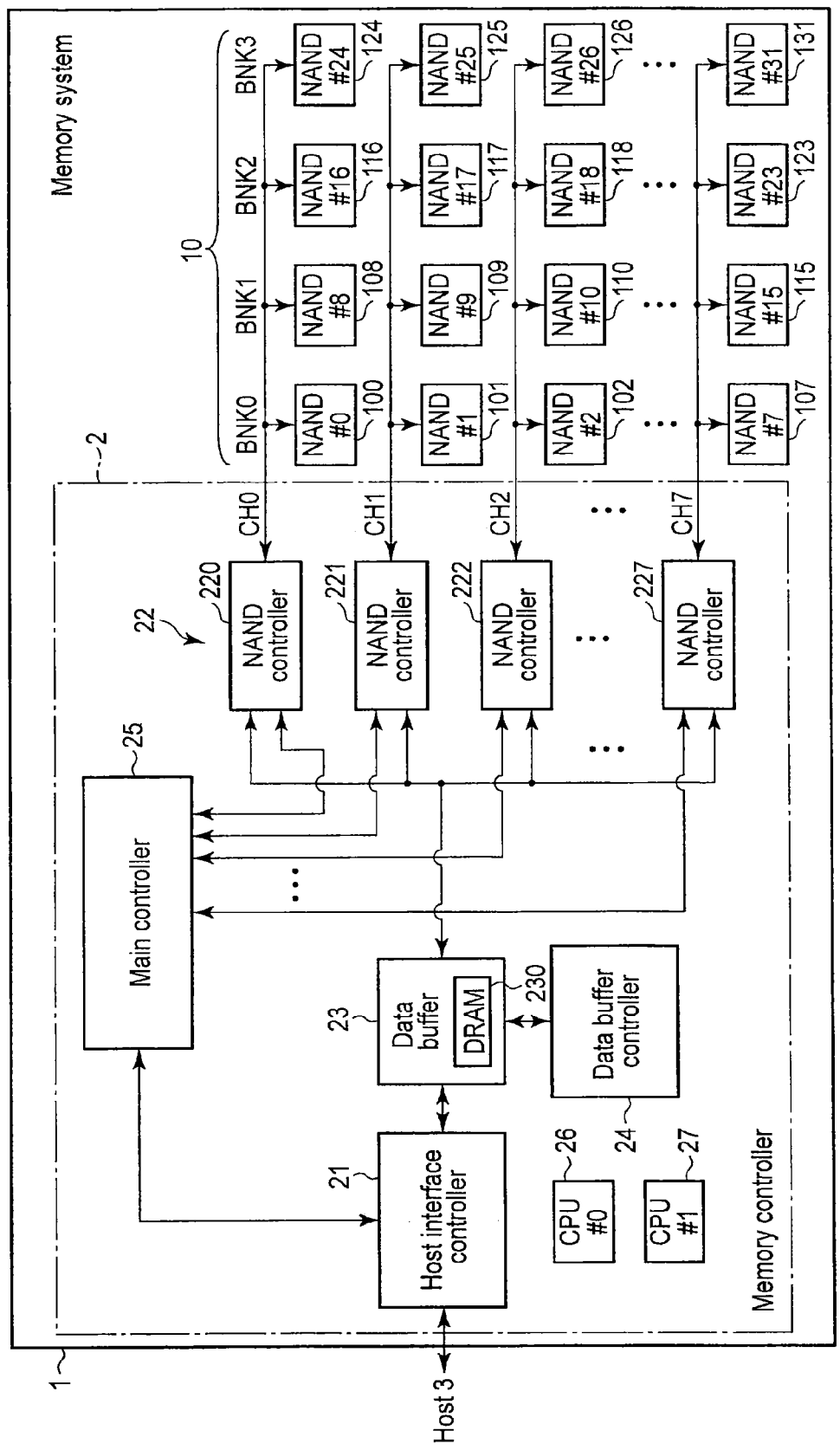
F I G. 1

MEMORY SYSTEM HAVING NAND-TYPE FLASH MEMORY AND MEMORY CONTROLLER WITH SHIFT READ CONTROLLER AND THRESHOLD VOLTAGE COMPARISON MODULE

CROSS-REFERENCE TO RELATED APPLICATIONS

This application claims the benefit of U.S. Provisional Application No. 61/693,442, filed Aug. 27, 2012, the entire contents of which are incorporated herein by reference.

FIELD

Embodiments described herein relate generally to a memory system having a NAND-type flash memory and a memory controller used in the system.

BACKGROUND

A NAND-type flash memory has conventionally been known as a reprogrammable nonvolatile (or non-transitory) memory. Also, a memory system such as a solid state drive (SSD) including the NAND-type flash memory has recently been developed.

Data retention (DR) of the NAND-type flash memory deteriorates when the memory is left to stand for long time periods. In the above-mentioned memory system, therefore, it is necessary to remove the influence of the deterioration of DR of the NAND-type flash memory. In this memory system, it is also necessary to remove the influence of program disturb (PD) and read disturb (RD). PD is a phenomenon in which data write changes the values (or threshold voltage) of nearby memory cells. RD is a phenomenon in which data read changes the values (or threshold voltage) of nearby memory cells.

Accordingly, if, for example, a read error has occurred under the influence of PD, RD, or DR (the deterioration of DR), a general conventional technique is to apply an operation of moving (i.e., rewriting) data in a first memory area containing the error to a second memory area different from the first memory area. This operation is called "refresh". Each of the first and second memory areas is, e.g., the unit of erase by which data are erased at once in the memory system. The refresh operation includes data read and write. If the refresh operation frequently occurs, therefore, the NAND-type flash memory may deteriorate. Also, in the conventional technique, a process of invalidating the first memory area as needed is performed after the refresh operation regardless of whether the cause of the error is PD, RD, or DR. Depending on the cause of the error, however, the influence on the first memory area sometimes improves when the NAND-type flash memory is left to stand. Accordingly, it is necessary to prevent the deterioration of the NAND-type flash memory caused by an unnecessary refresh operation, and prevent the decrease in capacity of the NAND-type flash memory caused by memory area invalidation.

BRIEF DESCRIPTION OF THE DRAWINGS

FIG. 1 is a block diagram showing an exemplary configuration of a memory system according to an embodiment;

DETAILED DESCRIPTION

Figure 2:
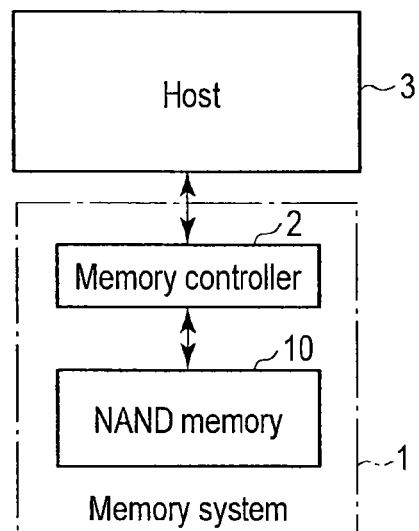
FIG. 2 is a block diagram showing an exemplary configuration of an electronic apparatus including the memory system shown in FIG. 1.

Various embodiments will be described hereinafter with reference to the accompanying drawings.

In general, according to one embodiment, a memory system comprises a NAND-type flash memory and a memory controller. The NAND-type flash memory comprises a plurality of memory areas including a first memory area and a second memory area. Each of the plurality of memory areas comprises a plurality of memory cells, and each of the plurality of memory cells stores one of a plurality of values. The memory controller is configured to control the NAND-type flash memory. The memory controller comprises a shift read controller, a threshold voltage distribution acquisition module, a table, a comparison module, and an error factor determination module. The shift read controller is configured to execute shift read for reading data from at least part of the memory area of the NAND-type flash memory by changing a read level of each of the values, if an error is detected in data read from the memory area. The error is detected based on an error correcting code added to the data. The threshold voltage distribution acquisition module is configured to detect threshold voltages of at least part of the memory cells in the memory area based on a result of the shift read executed by the shift read controller. The threshold voltage distribution acquisition module is further configured to acquire threshold voltage distribution data representing a threshold voltage distribution of each of the values by acquiring the number of memory cells of each of the detected threshold voltages. The acquired threshold voltage distribution data is stored in the table. The comparison module is configured to compare first threshold voltage distribution data with second threshold voltage distribution data, if the first threshold voltage distribution data is acquired in accordance with detection of the error in read of first data from the first memory area, while the second threshold voltage distribution data acquired in accordance with detection of the error in read of second data from the first memory area is stored in the table. The error factor determination module is configured to determine based on a result of the comparison whether a cause of the error is a first phenomenon in which data write exerts influence on values of nearby memory cells as non-write targets. The error factor determination module is further configured to inhibit a data move operation of moving data of the first memory area to the second memory area in accordance with the error, if the cause of the error is the first phenomenon.

FIG. 1 is a block diagram showing the configuration of the memory system according to the embodiment. A memory system 1 shown in FIG. 1 includes a NAND-type flash memory (to be referred to as a NAND memory hereinafter) 10 and memory controller 2. The NAND memory 10 includes a plurality of NAND memory chips, e.g., 32 NAND memory chips 100 (#0) to 131 (#31).

The NAND memory chips 100 to 131 each include a memory cell array. Each memory cell includes a floating gate, and changes the threshold voltage in accordance with the number of electrons stored in the floating gate. Accordingly, each memory cell stores a value (data) in accordance with the threshold voltage. In the embodiment, the NAND memory chips 100 to 131 are multilevel NAND memory chips, and each memory cell in the NAND memory chips 100 to 131 is a multilevel cell (MLC) for storing a value represented by multiple levels (i.e., data having two or more bits). In the embodiment, the NAND memory chips 100 to 131 are quaternary NAND memory chips, so each memory cell stores one of four values (i.e., two-bit data).

The NAND memory chips 100 to 131 are grouped by a matrix represented by channels CH0 to CH7 and banks BNK0 to BNK3. The channels CH0 to CH7 are transmission paths used in data transmission by NAND controllers 220 to 227 (to be described later). The banks BNK0 to BNK3 are the units of sets of NAND memory chips 1xx (xx=00, 01, . . . , 31) managed by the NAND controllers 220 to 227.

The NAND memory chips 1xx corresponding to the channels CH0 to CH7 can perform a parallel operation by the channels CH0 to CH7. Also, the NAND memory chips 1xx corresponding to the banks BNK0 to BNK3 can perform a bank interleave operation by the banks BNK0 to BNK3.

The memory controller 2 includes a host interface controller 21, NAND interface controller 22, data buffer 23, data buffer controller 24, main controller 25, CPU 26 (#0), and CPU 27 (#1). The host interface controller 21 is connected to a host 3 (see FIG. 2) to be described later, and receives commands (e.g., a write command and read command), addresses, and the like transferred from the host 3. The host interface controller 21 also transfers the received commands, addresses, and the like to the main controller 25. Furthermore, the host interface controller 21 controls data transfer between the host 3 and the memory system 1 (more specifically, the data buffer 23 in the memory system 1).

The NAND interface controller 22 controls the NAND memory 10 under the control of the main controller 25. The NAND interface controller 22 includes the NAND controllers 220 to 227. The NAND controllers 220 to 227 respectively access the NAND memory chips 1xx corresponding to the channels CH0 to CH7 in parallel through the channels CH0 to CH7. Based on an error correcting code (ECC) added to data read from the NAND memory chip 1xx, each of the NAND controllers 220 to 227 detects an error of the data and corrects the error. In the embodiment, the ECC is added for every two clusters as will be described later.

The data buffer 23 temporarily stores data (write data) transferred from the host 3 via the host interface controller 21, and data (read data) transferred from the NAND memory chips 1xx by the NAND controllers 220 and 227. The data buffer 23 comprises, for example, a dynamic random access memory (DRAM) 230. However, the data buffer 23 may also comprise a volatile random access memory other than the DRAM, or a nonvolatile random access memory such as a magnetoresistive random access memory (MRAM) or ferroelectric random access memory (FeRAM).

The data buffer controller 24 controls data read from the data buffer 23 (more specifically, the DRAM 230), and data write to the data buffer 23. The main controller 25 executes main control in the memory system 1. This main control includes comprehensive control of the NAND interface controller 22.

FIG. 2 is a block diagram showing an exemplary arrangement of an electronic apparatus including the memory system 1 shown in FIG. 1. The electronic apparatus shown in FIG. 2 includes the memory system 1 and the host apparatus (to be referred to as a host hereinafter) 3. In the embodiment, the electronic apparatus shown in FIG. 2 is a personal computer, and the memory system 1 is a solid state drive (SSD). The host 3 uses the memory system 1 as a data storage device of the host 3.

Note that the electronic apparatus shown in FIG. 2 need not always be the personal computer, and may also be, e.g., a video camera, music player, portable terminal, cell phone, or printer. Also, the electronic apparatus shown in FIG. 2 can include another data storage device, e.g., a hard disk drive (HDD), in addition to the memory system 1. Furthermore, the memory system 1 need not be an SSD, but may also be a memory card or universal serial bus (USB) memory.

Figure 3:
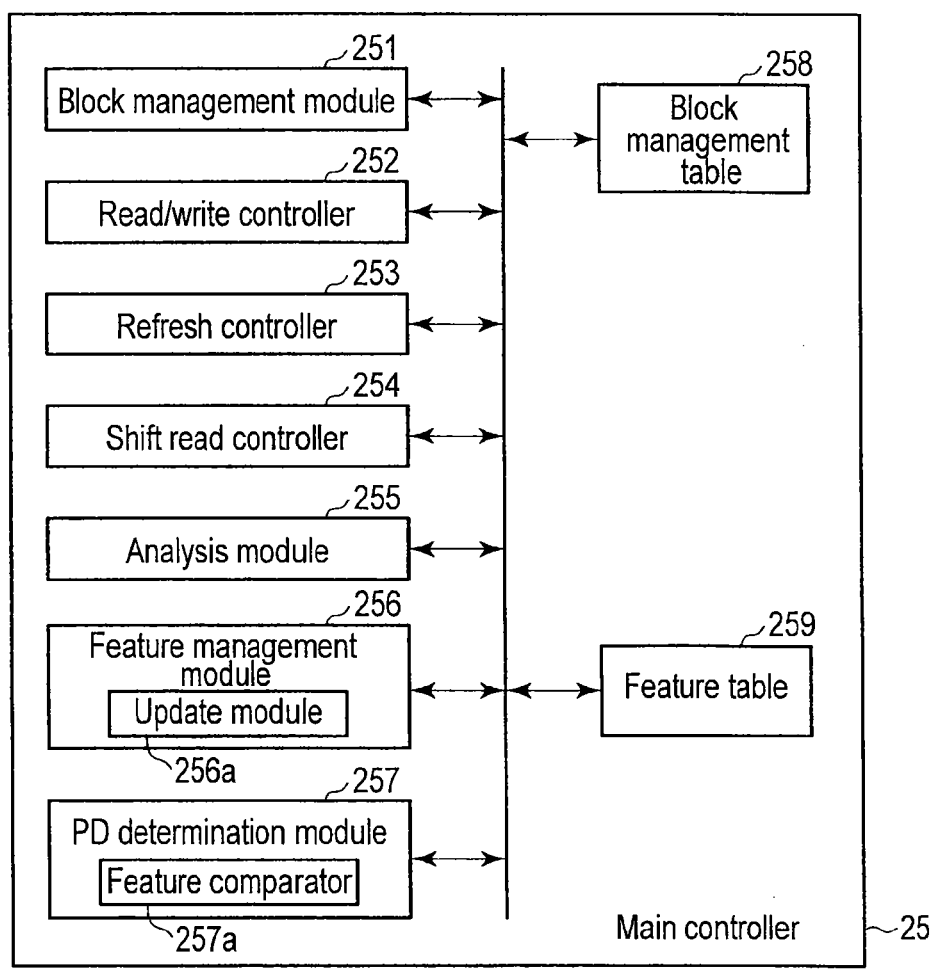
FIG. 3 is a block diagram showing an exemplary configuration of a memory controller shown in FIG. 1.

FIG. 3 is a block diagram showing an exemplary arrangement of the main controller 25 shown in FIG. 1. The main controller 25 shown in FIG. 3 includes a block management module 251, read/write controller 252, refresh controller 253, shift read controller 254, analysis module 255, feature management module 256, program disturb (PD) determination module 257, block management table 258, and feature table 259.

The block management module 251 constructs a plurality of blocks (memory areas) by using the NAND memory 10. In the embodiment, data is erased at once for each block. That is, the block is the unit of erase in the memory system 1. Each of the plurality of blocks includes a plurality of pages, and each of the plurality of pages includes a plurality of clusters. Each of the plurality of clusters includes a plurality of sectors. The cluster is a minimum unit of access in the memory system 1, and the sector is a minimum unit accessible from the host 3. In the embodiment, an error correcting code (ECC) is added for every two clusters. That is, error detection and error correction are performed for every two clusters.

The host 3 accesses the memory system 1 (more specifically, the NAND memory 10) by using a logical address. The block management module 251 translates the logical address into a physical address based on a logical-physical address translation table. The NAND interface controller 22 accesses the NAND memory 10 by using the physical address. The block management module 251 manages the state of each block by using the block management table 258. The read/write controller 252 controls data read/write by the NAND controllers 220 to 227. For example, in accordance with a read command which is transferred from the host 3 and received by the host interface controller 21, the read/write controller 252 instructs the NAND controller 22$y$ (y=0, 1, . . . , 7) to read data from the NAND memory chip 1xx. Also, in accordance with a write command from the host 3, the read/write controller 252 instructs the NAND controller 22$y$ to write data in the NAND memory chip 1xx. In addition, in accordance with an instruction from the refresh controller 253, the read/write controller 252 instructs the NAND controller 22$y$ to perform read/write of data necessary for a refresh operation.

The refresh controller 253 executes the refresh operation for each block by controlling the read/write controller 252. In the embodiment, the refresh operation includes an operation of moving (rewriting) data of a block to another block. That is, the refresh controller 253 functions as a data move (rewrite) controller. The refresh operation is normally executed for each block having deteriorated quality (more specifically, a block including a memory cell having deteriorated quality). The refresh operation can restore data of a block having deteriorated quality to a normal state. It is also possible to remove the influence of a memory cell having deteriorated quality on nearby memory cells.

The shift read controller 254 executes shift read by controlling the read/write controller 252 if a read error occurs. Shift read is an operation of reading data from a memory cell of the NAND memory chip 1xx while the read level for the memory cell is changed from, e.g., a reference level. In the embodiment, the shift read controller 254 reads data by shift read from at least some pages in a block containing a portion where a read error has occurred. Pages to be read are designated by physical addresses.

Based on the result of the shift read, the analysis module 255 acquires a value stored in each memory cell and the threshold voltage of the memory cell. The threshold voltage is one of important parameters when reading data from the NAND memory 10. Based on the acquired values and threshold voltages, the analysis module 255 acquires data representing the threshold voltage distribution of each of the values. The threshold voltage distribution represents frequencies of appearance of the threshold voltages (i.e., the number of memory cells from which the threshold voltages are obtained) with respect to a predetermined threshold voltage arrangement. In the embodiment in which the NAND memory chip 1xx is a quaternary NAND memory chip, the analysis module 255 acquires data representing the threshold voltage distribution of each of values 00, 01, 10, and 11. Thus, the analysis module 255 has the function of a threshold voltage distribution acquisition module. Furthermore, the analysis module 255 extracts the features (i.e., the statistical features) of the four threshold voltage distributions from them. Each of the features is, e.g., the median of the threshold voltage distribution.

The feature management module 256 manages the data representing the four threshold voltage distributions of each block and the features (medians) of the threshold voltage distributions by the feature table 259. The feature table 259 has first and second table areas for each block. One of the first and second table areas is used to store threshold voltage distribution data representing four latest threshold voltage distributions and data (medians) representing the features of the latest threshold voltage distributions. The other one of the first and second table areas is used to store threshold voltage distribution data representing four threshold voltage distributions older by one generation (more specifically, updated threshold voltage distributions older by one generation) and data (medians) representing the features of the threshold voltage distributions older by one generation. Note that if new threshold voltage distribution data is acquired because a new error is detected, the latest threshold voltage distribution data and the threshold voltage distribution data older by one generation (the updated threshold voltage distribution data older by one generation) respectively change to threshold voltage distribution data older by one generation and threshold voltage distribution data older by two generations (updated threshold voltage distribution data older by two generations). The following explanation is based on the state after this change. "Older by one generation" and "older by two generations" are based on the point of time of the latest error detection. Details of "older by one generation" and "older by two generations" will be described later. The feature management module 256 switches the roles of the first and second table areas whenever a new error is detected and new threshold voltage distribution data is acquired.

The feature management module 256 includes an update module 256a. The update module 256a updates the feature table 259 as follows based on threshold voltage distribution data newly acquired by the analysis module 255 (the threshold voltage distribution acquisition module). Assume that threshold voltage distribution data older by one generation is stored in one (e.g., the first table area) of the first and second table areas of the feature table 259. In this case, the update module 256a updates threshold voltage distribution data (third threshold voltage distribution data) stored in the first table area, based on the newly acquired threshold voltage distribution data (first threshold voltage distribution data). Also, the update module 256a updates the features (third medians) of four threshold voltage distributions (third threshold voltage distributions) indicated by the updated threshold voltage distribution data, based on the four threshold voltage distributions. Furthermore, the update module 256a replaces updated threshold voltage distribution data (second threshold voltage distribution data) older by two generations stored in the other one (e.g., the second table area) of the first and second table areas and the features (second medians) of four threshold voltage distributions (second threshold voltage distributions) indicated by the updated threshold voltage distribution data, with the newly acquired threshold voltage distribution data (first threshold voltage distribution data) and the features (first medians) of four threshold voltage distributions (first threshold voltage distributions) indicated by the updated threshold voltage distribution data. Thus, the roles of the first and second table areas are switched.

The PD (Program Disturb) determination module 257 determines based on four acquired threshold voltage distributions and the feature table 259 whether the cause of a read error is PD. For this determination, the PD determination module 257 includes a feature comparator 257a. The feature comparator 257a compares four acquired threshold voltage distributions (more specifically, the features of the updated four threshold voltage distributions) with four threshold voltage distributions older by one generation (more specifically, the features of four threshold voltage distributions older by one generation) stored in the feature table 259. The PD determination module 257 determines the shift directions of the four threshold voltage distributions based on the comparison result, and determines whether the cause of the read error is PD from the shift directions. The reason why the shift directions of the four threshold voltage distributions are used when determining the cause of the read error will be described later.

If the cause of the read error is not PD, the PD determination module 257 requests the refresh controller 253 to refresh a block containing a portion where the read error has occurred. On the other hand, if the cause of the read error is PD, the PD determination module 257 does not request the refresh controller 253 to refresh the block containing the portion where the read error has occurred.

CPU #0 and CPU #1 execute a predetermined program (e.g., firmware). In the embodiment, the block management module 251, read/write controller 252, refresh controller 253, shift read controller 254, analysis module 255, feature management module 256, and PD determination module 257 are software modules implemented by CPU #0 or CPU #1 by executing the program. However, some or all of these modules may also be hardware modules. If error correction by the NAND controller 22 is impossible, CPU #0 or CPU #1 performs an upper-level data restoration process called interchannel correction.

The block management table 258 stores, for each block, block management information indicating the state of the block. The block management information contains a block ID for identifying the corresponding block, and block state information indicating the state (block state) of the corresponding logical block.

The reason why the shift directions of four threshold voltage distributions are used to determine the cause of a read error will now be explained with reference to FIGS. 4A, 4B, 4C, 5A, 5B, and 6. In the embodiment, each memory cell of the NAND memory chip 1xx stores one of four values. That is, each memory cell stores one of four values (states) 00, 01, 10, and 11. For the descriptive convenience, values 00, 01, 10, and 11 will respectively be denoted by E, A, B, and C (or E level, A level, B level, and C level). Also, the threshold voltage distributions of E, A, B, and C will respectively be denoted by ED, AD, BD, and CD. Furthermore, read levels (read voltages) used to read E, A, B, and C from memory cells will be denoted by AR, BR, and CR. In the embodiment, read level BR is used to determine whether the value is one of E and A or one of B and C. If the value is E or A, read level AR is used to determine whether the value is E or A. If the value is B or C, read level CR is used to determine whether the value is B or C.

In the embodiment, E level is allocated to a negative threshold voltage of a memory cell. On the other hand, A, B, and C levels are allocated to different positive threshold voltages of memory cells. Of these positive threshold voltages, A level is allocated to the lowest threshold voltage, and C level is allocated to the highest threshold voltage. Accordingly, when threshold voltage distributions ED, AD, BD, and CD are arranged in ascending order of threshold voltage, the order is ED, AD, BD, and CD. Note that the relationship between the threshold voltages and E, A, B, and C can freely be defined.

Figure 4A:
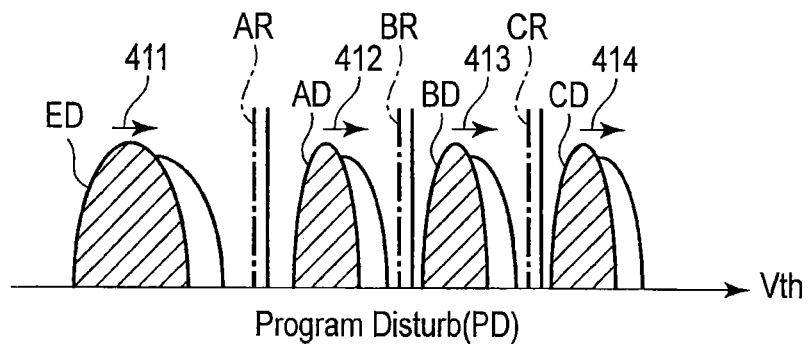
FIG. 4A is a view showing examples of the changes in threshold voltage distributions caused by program disturb.

FIG. 4A shows examples of the changes in threshold voltage distributions caused by PD (Program Disturb). PD is a phenomenon in which data write changes the values (or threshold voltages) of nearby memory cells. Generally, the threshold voltage distributions of memory cells having undergone the influence of PD tend to shift to the high-voltage side at all of E, A, B, and C levels. That is, all of threshold voltage distributions ED, AD, BD, and CD shift to a high-voltage side (i.e., in the same direction) as indicated by arrows 411, 412, 413, and 414 in FIG. 4A. In accordance with this shift of threshold voltage distributions ED, AD, BD, and CD, optimum read levels AR, BR, and CR also shift from levels indicated by the one-dot dashed lines to levels indicated by the solid lines in FIG. 4A. In the examples shown in FIG. 4A, the shift amounts of threshold voltage distributions ED, AD, BD, and CD are almost the same within the range of an error. The above-described phenomenon in which the threshold voltages of memory cells having undergone the influence of PD shift to the high-voltage side becomes significant in logarithmic proportion to the number of times of write or erase of the memory cells. Under the circumstances, the shapes (e.g., the half-widths) of threshold voltage distributions ED, AD, BD, and CD also change. The half-width will be described later.

Figure 4B:
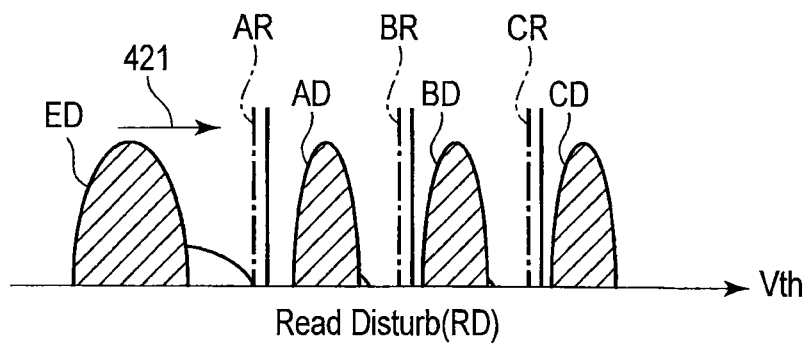
FIG. 4B is a view showing examples of the changes in threshold voltage distributions caused by read disturb.

FIG. 4B shows examples of the changes in threshold voltage distributions caused by RD (Read Disturb). RD is a phenomenon in which data read changes the values (or threshold voltages) of nearby memory cells. Generally, the threshold voltage distributions of memory cells having undergone the influence of RD tends to change at E level as the lowest voltage among E, A, B, and C levels. The reason is as follows. Memory cells undergo the influence of RD by the same principle as that of the influence of PD. In data read, however, a voltage (read voltage Vread) applied to nearby cells through an unselected word line is as low as 5 V as will be described later. Therefore, RD has influence on only memory cells at E level as the lowest voltage among E, A, B, and C levels. More specifically, the tail of threshold voltage distribution ED extends toward the high-voltage side as indicated by an arrow 421 in FIG. 4B. Consequently, optimum read level AR also shifts from a level indicated by the one-dot dashed line to a level indicated by the solid line in FIG. 4B.

DR (Data Retention) of a memory cell deteriorates when the memory cell is left to stand for a long time. This deterioration is caused by a phenomenon by which electrons are naturally released from a floating gate by a tunnel leak, and a phenomenon by which electrons trapped in an oxide film leak mainly due to exhaustion. The leak of the electrons trapped in the oxide film is maximum immediately after write, and reduces after that. The leak of the electrons trapped in the oxide film shifts threshold voltage distributions ED, AD, BD, and CD almost uniformly in the direction of a low voltage. However, threshold voltage distribution ED approaches 0 V due to the phenomenon in which electrons are naturally released from the floating gate by the tunnel leak. These two phenomena shift threshold voltage distribution ED toward 0 V (i.e., in the direction of a high voltage).

Figure 4C:
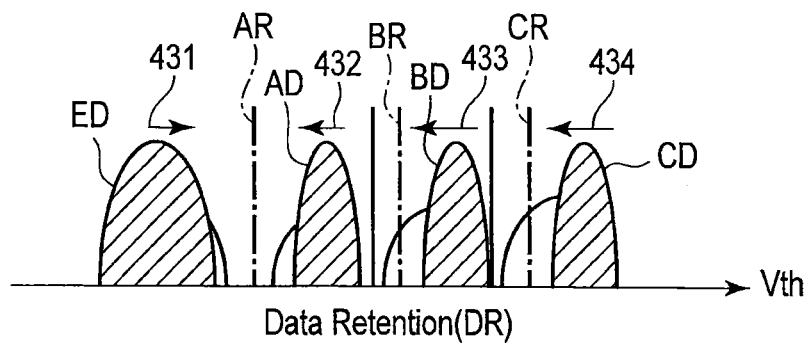
FIG. 4C is a view showing examples of the changes in threshold voltage distributions caused by the deterioration of data retention.

FIG. 4C shows examples of the changes in threshold voltage distributions caused by the deterioration of DR (Data Retention). As described above, the threshold voltage distributions of memory cells having undergone the influence of the deterioration of DR tend to shift in opposite directions at E level as the lowest voltage and at A, B, and C levels. More specifically, threshold voltage distribution ED shifts to the high-voltage side (i.e., toward 0 V) as indicated by an arrow 431 in FIG. 4C. By contrast, threshold voltage distributions AD, BD, and CD shift to the low-voltage side as indicated by arrows 432, 433, and 434 in FIG. 4C. This phenomenon in which the threshold voltage distributions of memory cells having undergone the influence of the deterioration of DR shift becomes significant in logarithmic proportion to the number of times of write or erase of the memory cells. The phenomenon is further affected by the environmental temperature and becomes conspicuous as the temperature rises.

Figure 5A:
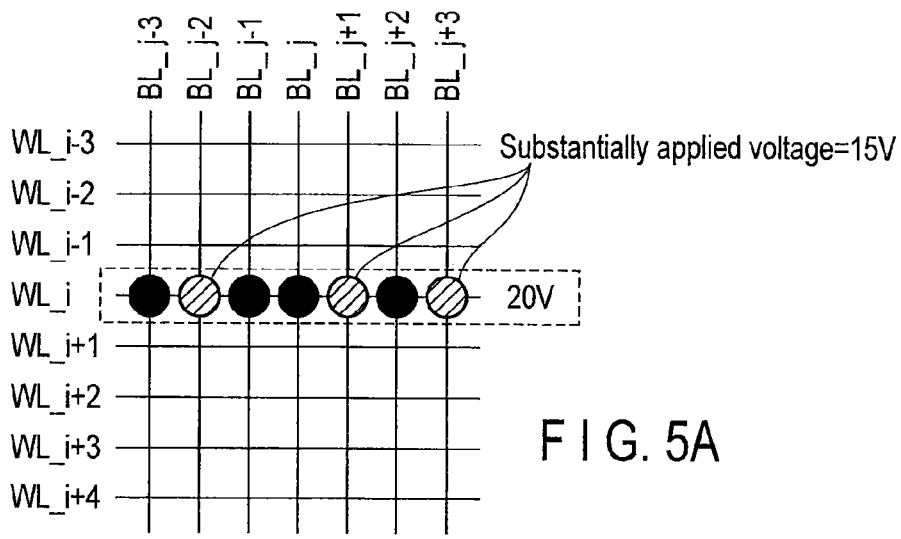
FIGS. 5A and 5B are views for explaining program disturb.
Figure 5B:
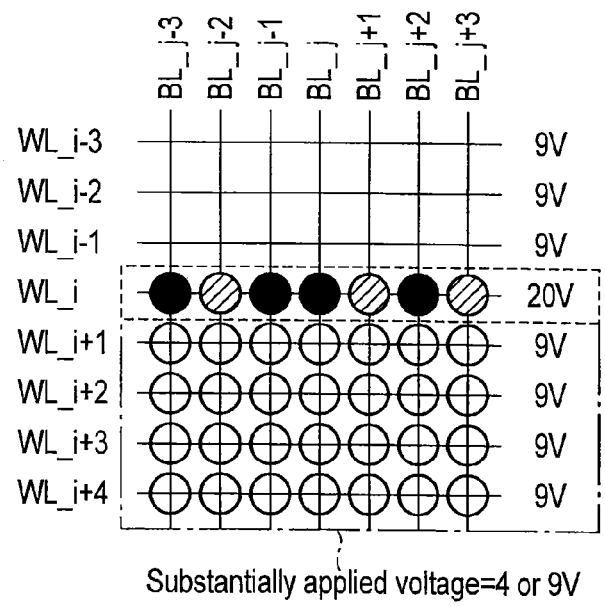

FIGS. 5A and 5B are views for explaining PD, and illustrate a portion of the memory cell array in the NAND memory chip 1xx. The memory cell array includes a plurality of word lines including word lines WL_i−3, . . . , WL_i, . . . , WL_i+4, and a plurality of bit lines including bit lines BL_j−3, . . . , BL_j, . . . , BL_j+3. Memory cells are arranged at the intersections of the plurality of word lines and the plurality of bit lines. Referring to FIG. 5A, only memory cells on the word line WL_i are indicated by circles, and other memory cells are omitted. Referring to FIG. 5B, on the other hand, only memory cells on the word lines WL_i to WL_i+4 are indicated by circles, and other memory cells are omitted.

In FIGS. 5A and 5B, among the memory cells on the word line WL_i, memory cells indicated by black circles are selected cells as data write targets, and memory cells indicated by hatched circles are unselected memory cells. Also, in FIG. 5B, all the memory cells (memory cells indicated by white circles) on the word lines WL_i+1 to WL_i+4 are unselected memory cells. Note that although not shown in FIG. 5B, all memory cells on the word lines WL_i−3 to WL_i−1 are unselected cells.

Unselected cells undergo the influence of PD. These unselected cells are classified into unselected cells on the selected word line WL_i on which the selected cells exist (i.e., the unselected cells indicated by the hatched circles), and unselected cells on unselected word lines near the selected word line WL_i (i.e., the unselected cells indicated by the white circles).

In the examples shown in FIGS. 5A and 5B, 20 V is applied to the word line (i.e., the selected word line) WL_i corresponding to the selected cells (the memory cells indicated by the black circles), and 9 V is applied to other word lines (i.e., the unselected word lines) WL_i−3 to WL_i−1 and WL_i+1 to WL_i+4. Also, 0 V is applied to the bit lines BL_j−3, BL_j−1, BL_j, and BL_j+2 corresponding to memory cell columns (i.e., strings) including the selected cells. Furthermore, 5 V is applied to the bit lines BL_j−2, BL_j+1, and BL_j+3 corresponding to memory cell columns (strings) including the unselected cells (the memory cells indicated by the hatched circles) on the selected word line WL_i.

Accordingly, in the memory call array of the NAND memory chip 1xx applied in the embodiment, substantially 20 V is applied to the selected cells on the selected word line WL_i. On the other hand, a high voltage of substantially about 15 V (20 V−5 V=15 V) as shown in FIG. 5A is applied to the unselected cells (the memory cells indicated by the hatched circles) on the selected word line WL_i. Therefore, a phenomenon in which small amounts of electrons are injected into the unselected cells on the selected word line WL_i occurs. That is, to unselected cells at E, A, B, or C level, a difference between a threshold voltage corresponding to the level and the applied voltage is substantially applied. Consequently, threshold voltage distributions ED, AD, BD, and CD in the unselected cells on the selected word line WL_i shift to the high-voltage side.

On the other hand, 9 V is applied to the unselected word lines near the selected word line WL_i as described above. As shown in FIG. 5B, therefore, a high voltage of about 4 V (9 V−5 V=4 V) or about 9 V (9 V−0 V=9 V) is substantially applied to the unselected cells on the unselected word lines. In FIG. 5B, among the unselected cells on the unselected word lines, 4 V is applied to unselected cells on the bit lines BL_j−2, BL_j+1, and BL_j+3 corresponding to strings including the unselected cells on the selected word line WL_i. Also, among the unselected cells on the unselected word lines, 9 V is applied to unselected cells on the bit lines BL_j−3, BL_j, and BL_j+2 corresponding to strings including the selected cells on the selected word line WL_i. Accordingly, threshold voltage distributions ED, AD, BD, and CD of the unselected cells on the unselected word lines also shift to the high-voltage side.

Figure 6:
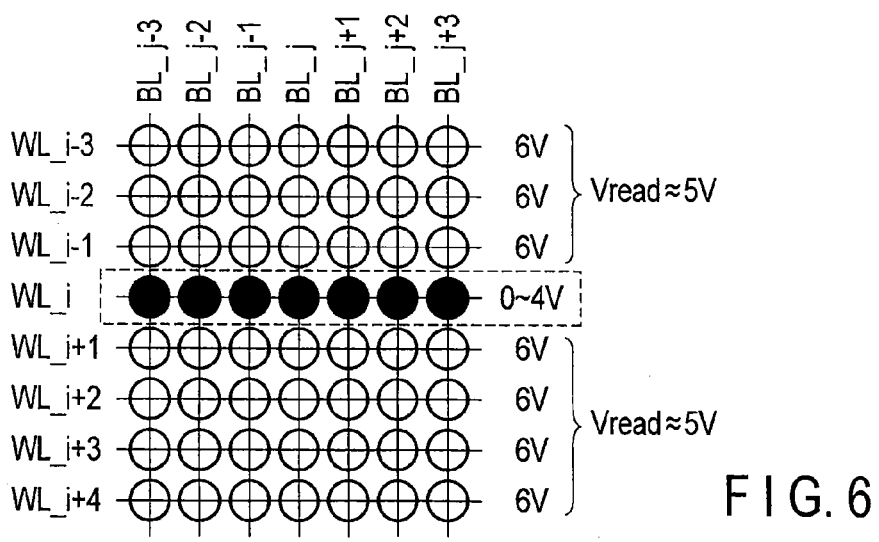
FIG. 6 is a view for explaining read disturb.

FIG. 6 is a view for explaining RD, and schematically shows a portion of the memory cell array in the NAND memory chip 1xx like FIGS. 5A and 5B. FIG. 6 shows an example in which the word line WL_i is selected and data are read from all the memory cells on the selected word line WL_i. Referring to FIG. 6, the memory cells on the selected word line WL_i (i.e., the memory cells as data read targets) are indicated by black circles, and memory cells on other word lines (unselected word lines) are indicated by white circles. A voltage corresponding to AR, BR, or CR described above, e.g., 0 to 4 V is applied as a read level to the selected word line WL_i. On the other hand, almost 5 V, for example, is applied as the read voltage Vread to the unselected word lines. In data read as described above, the voltage (read voltage Vread) to be applied to unselected word lines is low. Therefore, RD has influence on memory cells having low threshold voltages (more specifically, negative voltages) (i.e., memory cells at E level), but has almost no influence on memory cells having other threshold voltages (i.e., memory cells at levels other than E level). That is, as shown in FIG. 4B, the threshold voltage distribution of a memory cell having undergone the influence of RD changes at E level. Note that disturb (i.e., RD) of one read operation is very small. However, the influence of RD becomes conspicuous in proportion to the number of times of read. For example, the influence of RD becomes unignorable when read is repeated tens of thousands of times.

For the reasons explained above, PD, RD, and DR (more specifically, the deterioration of DR) have different influences on threshold voltage distributions ED, AD, BD, and CD. In particular, as shown in FIGS. 4A, 4B, and 4C, the shift directions of threshold voltage distributions ED, AD, BD, and CD change in accordance with which of PD, RD, and DR has exerted influence. Based on this difference between the shift directions of threshold voltage distributions, the present inventor has recognized that the influence of PD is canceled by the influences of RD and DR later. This means that even if a read error caused by PD occurs in the memory system 1 such as an SSD applied in the embodiment, it is unnecessary to urgently refresh a block containing a portion where the read error has occurred. In the embodiment, therefore, the PD determination module 257 determines whether the cause of a read error is PD in order to inhibit unnecessary refresh. Also, the PD determination module 257 performs this determination by using the difference between the shift directions of threshold voltage distributions ED, AD, BD, and CD caused by the difference between the influences of PD, RD, and DR.

Figure 7:
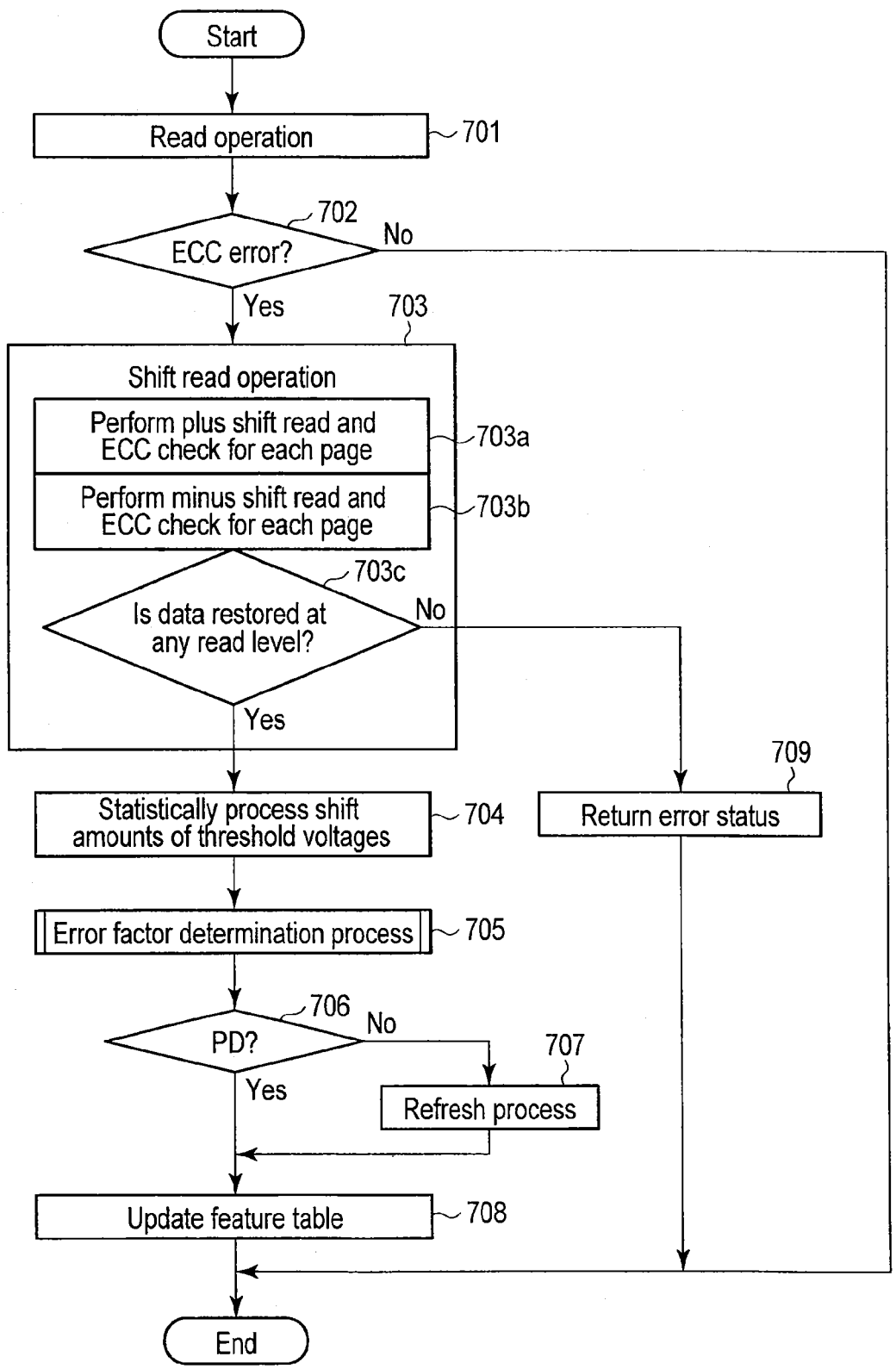
FIG. 7 is a flowchart showing an exemplary procedure of a read process in the embodiment.

The operation of the embodiment will be explained below with reference to FIG. 7 by taking a read process executed by the memory controller 2 in the memory system 1 as an example. FIG. 7 is a flowchart showing an exemplary procedure of the read process.

Assume that the host interface controller 21 of the memory controller 2 has received a read request from the host 3. The host interface controller 21 transfers this read request to the main controller 25. To simplify the explanation, assume that the read request is a request for read access to a given logical address LA.

Based on the read request transferred from the host interface controller 21 and the logical-physical address translation table, the block management module 251 of the memory controller 2 translates the requested logical address LA into a physical address PA allocated to the logical address LA. Based on the physical address PA translated from the logical address LA by the block management module 251, the read/write controller 252 executes a read operation of reading data from the NAND memory 10 through the channels CH0 to CH7 (block 701). This read operation includes issuing, to the NAND controllers 220 to 227, a plurality of read commands for reading data from the NAND memory 10.

The NAND controllers 220 to 227 access the NAND memory chips 1xx of the NAND memory 10 in accordance with the read commands from the read/write controller 252, thereby reading data designated by the read commands. The read data are temporarily stored in the buffer of the NAND controllers 220 to 227.

First to third memory cells as follows coexist in the memory cell array of the NAND memory chip 1xx. The first memory cell is a cell from which data can correctly be read. The second memory cell is a cell from which no data can correctly be read without a special operation under the influence of a normal write process or read process (i.e., PD or RD). The third memory cell is a cell from which no data can correctly be read without a special operation due to the natural release of electrons from a floating gate (i.e., the deterioration of DR), because the cell has not been accessed for a long time period. Accordingly, a read error occurs when reading data from a page or cluster including the second or third memory cell.

The NAND controller 22y executes well-known error detection by using an ECC added to the read data stored in the buffer. That is, the NAND controller 22y detects the presence/absence of an error (ECC error) of the read data by using the ECC added to the data. If an error is detected, i.e., if the read data has an error, the NAND controller 22y corrects the error of the read data based on the ECC. In the embodiment, the ECC is added for every two clusters. Therefore, the NAND controller 22y executes error detection and correction for every two clusters. However, the ECC may also be added for an access unit other than two clusters.

If the read data is correct, the NAND controller 22y transfers the read data to the data buffer 23. Also, if the error of the read data is corrected even when the read data has the error, the NAND controller 22y transfers the corrected read data to the data buffer 23 in order to prevent deterioration of the read performance. The data buffer controller 24 arranges the read data transferred to the data buffer 23 in the order of logical addresses, and transfers the arranged read data from the data buffer 23 to the host interface controller 21. The host interface controller 21 transfers the read data transferred from the data buffer 23 to the host 3.

If an error (ECC error) is detected, the NAND controller 22y records the result of error correction in, e.g., a predetermined register file. More specifically, the NAND controller 22y records a physical address (physical position) at which the error is detected, and the success/failure of error correction. If the error is uncorrectable, the NAND controller 22y also records the number of error bits in the register file. The register file is referred to in, e.g., a patrol process (to be described later).

The read/write controller 252 determines whether an error (read error) has occurred in the read operation by the NAND controller 22 (block 702). If it is determined that no error has occurred in the read operation (No in block 702), the read/write controller 252 terminates the read process. On the other hand, if it is determined that an error has occurred in the read operation (Yes in block 702), the read/write controller 252 transfers control to the shift read controller 254 regardless of the success/failure of correction of the error.

The shift read controller 254 executes a shift read operation to be described below (block 703). First, the shift read controller 254 repeats plus shift read and ECC check a predetermined number of times by using the NAND controller 22y, by designating a physical address for each of a plurality of pages forming a block LB containing a portion where the error has occurred (block 703a). Plus shift read is to read data (in this case, page data) by shifting read levels AR, BR, and CR and the read voltage Vread from their respective reference voltages to the high-voltage side. In the repetition of this plus shift read, the shift amounts of read levels AR, BR, and CR and the read voltage Vread are changed, e.g., stepwise. Also, a read operation using the same shift amount is repeated a plurality of number of times.

In addition, the shift read controller 254 repeats minus shift read and ECC check a predetermined number of times by using the NAND controller 22y, by designating a physical address for each of the plurality of pages (block 703b). Minus shift read is to read data by shifting read levels AR, BR, and CR and the read voltage Vread from their respective reference voltages to the low-voltage side. In the repetition of this minus shift read, the shift amounts of read levels AR, BR, and CR and the read voltage Vread are changed, e.g., stepwise. Also, a read operation using the same shift amount is repeated a plurality of number of times.

In the embodiment as described above, blocks 703a and 703b are executed for all pages in the block LB. However, blocks 703a and 703b may also be executed for only some pages (some areas), e.g., the first page, even-numbered pages, or odd-numbered pages in the block LB.

Based on the results of plus shift read (block 703a) and minus shift read (block 703b), the shift read controller 254 determines whether the data is restored at any read level (block 703c). In the embodiment, the shift read controller 254 determines that read data is restored not only when an ECC error of the read data is corrected in accordance with the detection of the error in the read data, but also when the data is correctly read.

If the NAND controller 22y is unable to correct the error in shift read, the CPU 26 (#0) or 27 (#1) restores the data by error correction at an upper level. This error correction at an upper level is performed by, e.g., using data read through 15 channels other than the channel where the error has occurred. Error correction like this is called inter-channel correction. If the error is corrected by inter-channel correction, the shift read controller 254 determines that the data is restored at any read level. On the other hand, if the error is not corrected even by inter-channel correction, the shift read controller 254 determines that the data is not restored at any read level.

If the data is not restored at any read level (No in block 703c), the shift read controller 254 returns control to the read/write controller 252. The read/write controller 252 returns an error status to the requestor of the read process (block 709). In the embodiment in which the requestor of the read process is the host 3, the error status is returned to the host 3 via the host interface controller 21. In this case, the host 3 can perform a data restoration process at a still upper level.

On the other hand, if the data is restored at any read level (i.e., one or more read levels) (Yes in block 703c), i.e., if the data is restored in the memory controller 2, the shift read controller 254 transfers control to the analysis module 255. Based on the shift read result of each page, the analysis module 255 detects the value (i.e., data E, A, B, or C) of a memory cell from which the value is correctly read, and the threshold voltage of the memory cell (block 704). The threshold voltage of the memory cell is detected by detecting the boundary between a read level used when the value is correctly read and a read level used when the value is not correctly read. In block 704, the analysis module 255 functions as a threshold voltage distribution acquisition module, and statistically processes the acquired threshold voltages in accordance with the values. That is, the analysis module 255 acquires the number of memory cells of each detected threshold voltage, and sorts the numbers of memory cells in ascending order of threshold voltage. Thus, the analysis module 255 acquires threshold voltage distribution data representing the threshold voltage distribution of each of the values, i.e., acquires threshold voltage distribution data (first threshold voltage distribution data) representing the latest threshold voltage distributions (first threshold voltage distributions) of data E, A, B, and C.

Data as follows is generally written in the NAND memory by taking account of the influence on adjacent memory cells. This data is data randomized such that the numbers of 0s and 1s are uniformized as much as possible. As described previously, the NAND memory chips 100 to 131 applied to the NAND memory 10 in the embodiment are quaternary NAND memory chips (i.e., multilevel NAND memory chips). When the NAND memory 10 is thus comprised quaternary NAND memory chips (the NAND memory chips 100 to 131), data to be written in the NAND memory 10 is randomized such that the ratios of 00(E), 01(A), 10(B), and 11(C) are statistically uniformized.

Accordingly, the analysis module 255 can accurately acquire threshold voltage distribution data representing the latest threshold voltage distributions of data E, A, B, and C in the block LB when an error is detected, by statistically processing the threshold voltages as described above. In addition, the analysis module 255 analyzes the arrangements of the threshold voltages in the latest threshold voltage distributions of data E, A, B, and C, thereby acquiring values positioned in the centers of the threshold voltage arrangements, i.e., the medians of the latest threshold voltage distributions. That is, the analysis module 255 extracts the medians (first medians) of the latest threshold voltage distributions (first threshold voltage distributions) of data E, A, B, and C, as features EFnew, AFnew, BFnew, and CFnew of the latest threshold voltage distributions.

Figure 8:
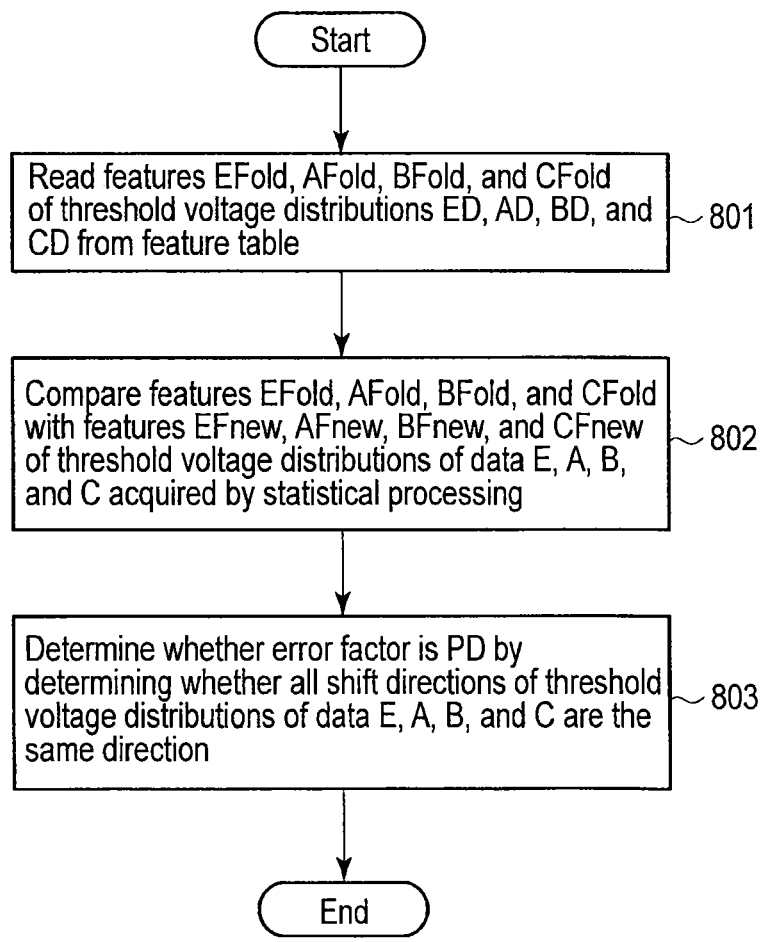
FIG. 8 is a flowchart showing an exemplary procedure of an error factor determination process in the embodiment.

The PD determination module 257 executes an error factor determination process (block 705) of determining whether the cause of the read error is PD, based on the extracted features EFnew, AFnew, BFnew, and CFnew and the feature table 259. Details of the error factor determination process will be explained below with reference to FIG. 8. FIG. 8 is a flowchart showing an exemplary procedure of the error factor determination process. To simplify the explanation, threshold voltage distribution data representing the threshold voltage distribution will simply be called a threshold voltage distribution hereinafter.

First, assume that when an error is detected this time, threshold voltage distributions ED, AD, BD, and CD older by one generation (third threshold voltage distributions) concerning the block LB are stored in one (e.g., the first table area) of the first and second table areas of the feature table 259 associated with the block LB. Assume also that the features (third medians) of threshold voltage distributions ED, AD, BD, and CD older by one generation are stored in the first table area.

The threshold voltage distribution older by one generation (the third threshold voltage distribution) is a threshold voltage distribution acquired by the analysis module 255 (the threshold voltage distribution acquisition module) at the first point of time at which an error (read error) is detected in the block LB in a read operation before the point of time at which an error is detected this time. Note that updated threshold voltage distributions ED, AD, BD, and CD older by two generations (second threshold voltage distributions) concerning the block LB are stored in the other one (e.g., the second table area) of the first and second table areas.

Note also that features (second medians) EFold, AFold, BFold, and CFold of updated threshold voltage distributions ED, AD, BD, and CD older by two generations are stored in the second table area. Updated threshold voltage distributions ED, AD, BD, and CD older by two generations are acquired by the update module 256a by updating threshold voltage distributions ED, AD, BD, and CD older by two generations (fourth threshold voltage distributions) based on threshold voltage distributions ED, AD, BD, and CD older by one generation (the third threshold voltage distributions). That is, updated threshold voltage distributions ED, AD, BD, and CD older by two generations are acquired based on the threshold voltages of at least part of memory cells in the block LB before the point of time at which an error is detected this time. The threshold voltage distribution older by two generations (the fourth threshold voltage distribution) is a threshold voltage distribution acquired by the analysis module 255 (the threshold voltage distribution acquisition module) at the second point of time at which an error is detected in the block LB in a read operation before the first point of time.

At the beginning of the error factor determination process, the PD determination module 257 reads features (second medians) EFold, AFold, BFold, and CFold of updated threshold voltage distributions (second threshold voltage distributions) ED, AD, BD, and CD older by two generations concerning the block LB from the second table area of the feature table 259 (block 801).

The feature comparator 257a of the PD determination module 257 compares features (second medians) EFold, AFold, BFold, and CFold of threshold voltage distributions (second threshold voltage distributions) ED, AD, BD, and CD concerning the block LB read from the feature table 259 with features (first medians) EFnew, AFnew, BFnew, and CFnew of the latest threshold voltage distributions (first threshold voltage distributions) of data E, A, B, and C concerning the block LB (block 802).

Based on the comparison result from the feature comparator 257a, the PD determination module 257 determines whether all the shift directions of the threshold voltage distributions of data E, A, B, and C are the same direction (block 803). More specifically, the PD determination module 257 determines whether the medians of the corresponding threshold voltage distributions indicated by features EFnew, AFnew, BFnew, and CFnew have shifted to the high-voltage side with respect to those indicated by features EFold, AFold, BFold, and CFold. If each median has shifted to the high-voltage side, the PD determination module 257 determines that all the shift directions of the threshold voltage distributions of data E, A, B, and C are the same direction. Note that if the shift amount of the median of a threshold voltage distribution is less than a reference value, the PD determination module 257 may also determine that the threshold voltage distribution has not shifted.

The PD determination module 257 thus determines in block 803 whether all the shift directions of the threshold voltage distributions of data E, A, B, and C are the same direction, and, based on the determination result, determines whether the cause of the read error is PD. In the embodiment, if all the shift directions of the four threshold voltage distributions are the same direction, the PD determination module 257 determines that the cause of the read error is PD.

Note that the PD determination module 257 may also determine whether the cause of the read error is PD by using another parameter representing the feature of each of threshold voltage distributions of data E, A, B, and C, e.g., the half-width (more specifically, the full width at half maximum), in addition to the median of the threshold voltage distribution. The half-width is the width of a threshold voltage distribution at which the frequency of appearance is ½ the peak value (i.e., the maximum frequency of appearance) of the distribution. In this case, for the threshold voltage distribution of each of data E, A, B, and C, the PD determination module 257 calculates the ratio of the shift of the median from the threshold voltage in the central position of the half-width, and determines whether the ratio of the shift has exceeded a reference value. If the ratio of the shift has exceeded the reference value, the PD determination module 257 determines that the shape of the threshold voltage distribution has changed. In this case, the PD determination module 257 determines that it is impossible to determine whether the cause of the error is PD based on the shift direction of the threshold voltage distribution. Therefore, the PD determination module 257 determines that the error factor is other than PD without determining the shift direction of the threshold voltage distribution. It is possible to further increase the accuracy of the determination of whether the error factor is PD by thus taking account of the shift of the median from the threshold voltage in the central position of the half-width.

The error factor determination process (block 705) is complete when the PD determination module 257 executes block 803. Then, the PD determination module 257 determines whether the determination result of the error factor determination process is PD (i.e., whether the cause of the read error is PD) (block 706). If the cause of the read error is other than PD (No in block 706), the PD determination module 257 requests the refresh controller 253 to refresh the block LB (i.e., the block LB containing the portion where the read error has occurred). That is, if at least one of the shift directions of the threshold voltage distributions of data E, A, B, and C is different from the shift directions of other threshold voltage distributions, the PD determination module 257 requests refresh of the block LB.

The refresh controller 253 performs a refresh process of refreshing the block LB by controlling the read/write controller 252 in accordance with the refresh request (block 707). In the refresh process, the refresh controller 253 reads data (e.g., valid data as the latest data) of the block LB (the first memory area), and moves (writes) the read data to another block (the second memory area) different from the block LB. That is, the refresh controller 253 rewrites the data of the block LB in the other block. In this case, the block management module 251 updates the logical-physical address translation table, and changes the correspondence between the physical address of the block LB and logical address to the correspondence between the physical address of the other block and the logical address. In this process, the block management module 251 may invalidate the block LB. The invalidated block is called a bad block (BB). When completing the refresh process (block 707), the read/write controller 252 transfers control to the feature management module 256.

On the other hand, if the cause of the read error is PD (Yes in block 706), the PD determination module 257 determines refresh of the block LB is unnecessary. This is so because, as described previously, the influence of PD on the block LB is often canceled by the influences of RD and DR later. That is, PD often improves when the block LB is left to stand. In this case, the PD determination module 257 inhibits the refresh request to the refresh controller 253, and transfers control to the feature management module 256. This makes it possible to prevent the deterioration of the NAND memory 10 by preventing an unnecessary refresh operation. It is also possible to prevent the decrease in capacity of the NAND memory 10 by preventing unnecessary block invalidation. Accordingly, the embodiment can prolong the life of the memory system 1 including the NAND memory 10.

By contrast, if an uncorrectable error is detected in a read operation of a conventional technique, data of the block LB is restored by a shift read operation, and the restored data is moved to another block by a refresh operation. This refresh operation is executed without taking the cause of the error into consideration. That is, the refresh operation necessitated by the read error is performed regardless of whether the cause of the error is PD, RD, or DR. As described above, however, PD tends to recover when the block LB is left to stand. In the conventional technique that performs the refresh operation regardless of the cause of the error, therefore, an unnecessary refresh operation may frequently occur and deteriorate the NAND flash memory. This may also cause unnecessary block invalidation and decrease the capacity of the NAND memory 10.

When control is transferred from the refresh controller 253 or PD determination module 257, the feature management module 256 updates the threshold voltage distributions older by one generation (the third threshold voltage distributions) concerning the block LB stored in the first table area of the feature table 259, based on the threshold voltage distributions newly acquired by the analysis module 255 (block 708). More specifically, the feature management module 256 reflects (i.e., merges) the newly acquired threshold voltage distributions (i.e., the new statistical processing results) on the threshold voltage distributions older by one generation concerning the block LB stored in the first table area, thereby updating the threshold voltage distributions older by one generation. Also, based on the updated threshold voltage distributions, the feature management module 256 updates the medians (third medians) of the unupdated threshold voltage distributions (third threshold voltage distributions) to the medians of the updated threshold voltage distributions. If a read error is detected next in the block LB, the updated threshold voltage distributions in the first table area are used as updated threshold voltage distributions older by two generations based on the point of time of the error detection.

Furthermore, in block 708, the feature management module 256 replaces the updated threshold voltage distributions (second threshold voltage distributions) older by two generations and their medians (second medians) concerning the block LB stored in the first table area of the feature table 259 with the newly acquired threshold voltage distributions (first threshold voltage distributions) and their medians (first medians). Thus, the above-mentioned read process is complete.

In the above embodiment, the read process is executed in accordance with the request from the host 3. However, the read process may also be executed autonomously in the memory system 1 independently of the host 3. An example of this autonomous read process is a patrol process of testing the NAND memory 10. In this patrol process, the main controller 25 refers to the register file mentioned earlier, and preferentially tests a block containing a physical position where an error cannot be corrected.

In the above embodiment, if a read error (ECC error) is detected, the shift read operation is executed regardless of whether the error is corrected. If the error is corrected, however, the read process may be terminated without performing any shift read operation, in the same manner as when no read error is detected.

In the above embodiment, a memory cell of the NAND memory 10 stores one of four values. However, the memory cell may also be a single-level cell (SLC) that stores one of two values, i.e., a binary-level cell, or a multilevel cell (MLC) that stores one of values exceeding four.

At least one embodiment explained above can reduce unnecessary refresh operations and memory area invalidation, thereby prolonging the product life.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a NAND-type flash memory comprising a plurality of memory areas including a first memory area and a second memory area, each of the plurality of memory areas comprising a plurality of memory cells, and each of the plurality of memory cells storing one of a plurality of values; and
   a memory controller configured to control the NAND-type flash memory,
   wherein the memory controller comprises:
   a shift read controller configured to execute shift read for reading data from at least part of the memory area of the NAND-type flash memory by changing a read level of each of the values, if an error is detected in data read from the memory area, wherein the error is detected based on an error correcting code added to the data;

a threshold voltage distribution acquisition module configured to detect threshold voltages of at least part of the memory cells in the memory area based on a result of the shift read executed by the shift read controller, and to acquire threshold voltage distribution data representing a threshold voltage distribution of each of the values by acquiring the number of memory cells of each of the detected threshold voltages;

a table in which the acquired threshold voltage distribution data is stored;

a comparison module configured to compare first threshold voltage distribution data with second threshold voltage distribution data, if the first threshold voltage distribution data is acquired in accordance with detection of the error in read of first data from the first memory area, wherein the second threshold voltage distribution data is acquired in accordance with detection of the error in a read of second data from the first memory area and is stored in the table; and an error factor determination module configured to determine based on a result of the comparison whether a cause of the error is a first phenomenon in which a data write exerts influence on values of nearby memory cells as non-write targets, and to inhibit a data move operation of moving data of the first memory area to the second memory area in accordance with the error, if the cause of the error is the first phenomenon.

2. The memory system of claim 1, wherein the error factor determination module is configured to determine whether the cause of the error is the first phenomenon, by determining based on the result of the comparison whether all directions of shifts of first threshold voltage distributions indicated by the first threshold voltage distribution data from second threshold voltage distributions indicated by the second threshold voltage distribution data are a same direction.

3. The memory system of claim 2, wherein the comparison module is further configured to compare first medians of the first threshold voltage distributions with second medians of the second threshold voltage distributions.

4. The memory system of claim 1, wherein the memory controller further comprises an update module configured:

to store fourth threshold voltage distribution data in the table, if the fourth threshold voltage distribution data is acquired in accordance with detection of an error in a read of third data from the first memory area, to update the fourth threshold voltage distribution data stored in the table to the second threshold voltage distribution data based on third threshold voltage distribution data, and to store the third threshold voltage distribution data in the table, if the third threshold voltage distribution data is acquired in accordance with detection of the error in a read of the second data after the fourth threshold voltage distribution data is acquired, and to update the third threshold voltage distribution data stored in the table based on the first threshold voltage distribution data, and to store the first threshold voltage distribution data in the table instead of the second threshold voltage distribution data, if the first threshold voltage distribution data is acquired.

5. The memory system of claim 4, wherein:

the comparison module is further configured to compare first medians of the first threshold voltage distributions with second medians of the second threshold voltage distributions;

the second medians are stored in the table in association with the second threshold voltage distribution data, and third medians of the third threshold voltage distributions are stored in the table in association with the third threshold voltage distribution data; and the update module is further configured to update the third medians in accordance with the update of the third threshold voltage distribution data.

6. The memory system of claim 1, wherein:

the memory controller further comprises a data move controller configured to execute the data move operation; and the error factor determination module is further configured to instruct the data move controller to perform the data move operation if the cause of the error is other than the first phenomenon, and to inhibit the instruction to the data move controller if the cause of the error is the first phenomenon.

7. The memory system of claim 1, wherein the threshold voltage distribution acquisition module is configured to detect each of the threshold voltages of the memory cells by detecting a boundary between a read level used when a value is correctly read and a read level used when a value is not correctly read.

8. A memory controller configured to control a NAND-type flash memory comprising a plurality of memory areas including a first memory area and a second memory area, each of the plurality of memory areas comprising a plurality of memory cells, each of the plurality of memory cells storing one of a plurality of values, and the memory controller comprising:

a shift read controller configured to execute shift read for reading data from at least part of the memory area of the NAND-type flash memory by changing a read level of each of the values, if an error is detected in data read from the memory area, wherein the error is detected based on an error correcting code added to the data;

a threshold voltage distribution acquisition module configured to detect threshold voltages of at least part of the memory cells in the memory area based on a result of the shift read executed by the shift read controller, and to acquire threshold voltage distribution data representing a threshold voltage distribution of each of the values by acquiring a number of memory cells of each of the detected threshold voltages;

a table in which the acquired threshold voltage distribution data is stored;

a comparison module configured to compare first threshold voltage distribution data with second threshold voltage distribution data, if the first threshold voltage distribution data is acquired in accordance with detection of the error in read of first data from the first memory area, wherein the second threshold voltage distribution data is acquired in accordance with detection of the error in read of second data from the first memory area and is stored in the table; and an error factor determination module configured to determine based on a result of the comparison whether a cause of the error is a first phenomenon in which data write exerts influence on values of nearby memory cells as non-write targets, and to inhibit a data move operation of moving data of the first memory area to the second memory area in accordance with the error, if the cause of the error is the first phenomenon.

9. The memory controller of claim 8, wherein the error factor determination module is configured to determine whether the cause of the error is the first phenomenon, by determining based on the result of the comparison whether all directions of shifts of first threshold voltage distributions indicated by the first threshold voltage distribution data from second threshold voltage distributions indicated by the second threshold voltage distribution data are a same direction.

10. The memory controller of claim 9, wherein the comparison module is further configured to compare first medians of the first threshold voltage distributions with second medians of the second threshold voltage distributions.

11. The memory controller of claim 8, further comprising an update module configured to:
   to store fourth threshold voltage distribution data in the table, if the fourth threshold voltage distribution data is acquired in accordance with detection of an error in a read of third data from the first memory area,
   to update the fourth threshold voltage distribution data stored in the table to the second threshold voltage distribution data based on third threshold voltage distribution data, and to store the third threshold voltage distribution data in the table, if the third threshold voltage distribution data is acquired in accordance with detection of the error in a read of the second data after the fourth threshold voltage distribution data is acquired, and
   to update the third threshold voltage distribution data stored in the table based on the first threshold voltage distribution data, and to store the first threshold voltage distribution data in the table instead of the second threshold voltage distribution data, if the first threshold voltage distribution data is acquired.

12. The memory controller of claim 11, wherein:
   the comparison module is further configured to compare first medians of the first threshold voltage distributions with second medians of the second threshold voltage distributions;
   the second medians are stored in the table in association with the second threshold voltage distribution data, and third medians of the third threshold voltage distributions are stored in the table in association with the third threshold voltage distribution data; and
   the update module is further configured to update the third medians in accordance with the update of the third threshold voltage distribution data.

13. The memory controller of claim 8, further comprising a data move controller configured to execute the data move operation,
   wherein the error factor determination module is further configured to instruct the data move controller to perform the data move operation if the cause of the error is other than the first phenomenon, and to inhibit the instruction to the data move controller if the cause of the error is the first phenomenon.

14. The memory controller of claim 8, wherein the threshold voltage distribution acquisition module is configured to detect each of the threshold voltages of the memory cells by detecting a boundary between a read level used when a value is correctly read and a read level used when a value is not correctly read.

15. A memory system comprising:
   a NAND-type flash memory; and
   a controller configured to control the NAND-type flash memory,
   wherein the controller is configured to:
   detect an error in data read from a first memory area;
   check a cause of the error based on a shift read operation; and
   determine whether to write data of the first memory area into a second memory area different from the first memory area based on the cause of the error.

16. The memory system of claim 15, wherein the controller is configured to check the cause of the error by referring to a potential.

17. The memory system of claim 16, wherein the controller is configured to check the cause of the error by referring to a transition of the potential.

18. A memory system comprising:
   a NAND-type flash memory; and
   a controller configured to control the NAND-type flash memory,
   wherein the controller is configured to:
   determine whether to perform an operation for writing data of a first memory area into a second memory area different from the first memory area, when an error is detected in data read from the first memory area;
   check a cause of the error; and
   change the operation, in a case where the cause of the error results from writing data into the first memory area.

\* \* \* \* \*